(12) United States Patent
Goldsby

(10) Patent No.: US 9,725,821 B1
(45) Date of Patent: Aug. 8, 2017

(54) CAVITY PULL ROD: DEVICE TO PROMOTE SINGLE CRYSTAL GROWTH FROM THE MELT

(71) Applicant: The United States of America, as represented by the Administrator of the National Aeronautics and Space Administration, Washington, DC (US)

(72) Inventor: Jon Goldsby, North Olmsted, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 271 days.

(21) Appl. No.: 14/633,467

(22) Filed: Feb. 27, 2015

Related U.S. Application Data

(60) Provisional application No. 61/945,900, filed on Feb. 28, 2014.

(51) Int. Cl.

| | |
|---|---|
| *C30B 15/20* | (2006.01) |
| *C30B 15/30* | (2006.01) |
| *C30B 29/06* | (2006.01) |
| *C30B 29/52* | (2006.01) |
| *B22D 27/04* | (2006.01) |
| *B22D 25/06* | (2006.01) |
| *B22C 9/06* | (2006.01) |
| *B22D 21/00* | (2006.01) |

(52) U.S. Cl.
CPC ............... *C30B 15/30* (2013.01); *B22C 9/06* (2013.01); *B22D 21/007* (2013.01); *B22D 25/06* (2013.01); *B22D 27/045* (2013.01); *C30B 29/06* (2013.01); *C30B 29/52* (2013.01)

(58) Field of Classification Search
CPC .......... C30B 15/10; C30B 15/20; C30B 15/32
See application file for complete search history.

(56) References Cited

U.S. PATENT DOCUMENTS

| | | |
|---|---|---|
| 4,239,583 A | 12/1980 | Hatch et al. |
| 4,605,468 A | 8/1986 | Pastor |
| 5,116,456 A | 5/1992 | Nestor |
| 5,871,580 A | 2/1999 | Asahi et al. |
| 6,153,007 A | 11/2000 | Nakata |
| 6,660,082 B2 * | 12/2003 | Weber ............... C30B 15/04 117/19 |
| 6,949,140 B2 | 9/2005 | Sarayama et al. |
| 7,175,705 B2 | 2/2007 | Fujimura et al. |
| 8,475,593 B2 | 7/2013 | Iwata et al. |
| 2005/0241570 A1 | 11/2005 | Lebbou et al. |
| 2009/0241829 A1 | 10/2009 | Han et al. |
| 2011/0168080 A1 | 7/2011 | Condon et al. |
| 2012/0085279 A1 | 4/2012 | Sarayama et al. |
| 2012/0260849 A1 | 10/2012 | Clark |

\* cited by examiner

*Primary Examiner* — Robert M Kunemund
(74) *Attorney, Agent, or Firm* — Robert H. Earp, III

(57) ABSTRACT

A pull rod for use in producing a single crystal from a molten alloy is provided that includes an elongated rod having a first end and a second end, a first cavity defined at the first end and a second cavity defined at the first end and in communication with the first cavity. The first cavity receives the molten alloy and the second cavity vents a gas from the molten alloy to thereby template a single crystal when the pull rod is dipped into and extracted from the molten alloy.

20 Claims, 4 Drawing Sheets

CAVITY PULL ROD: DEVICE TO PROMOTE SINGLE CRYSTAL GROWTH FROM THE MELT

CROSS-REFERENCE TO RELATED APPLICATIONS

This application claims the benefit of U.S. Provisional Patent application Ser. No. 61/945,900 entitled "CAVITY PULL ROD: DEVICE TO PROMOTE SINGLE CRYSTAL GROWTH FROM THE MELT" filed on Feb. 28, 2014. The entirety of the above-noted application is incorporated herein by reference.

ORIGIN OF THE INVENTION

The invention described herein was made by an employee (or employees, as appropriate) of the United States Government and may be manufactured and used by or for the Government for Government purposes without the payment of any royalties thereon or therefore.

BACKGROUND

The unique problem of growing single crystal from a melt involves the selective growth of a single or dominate growth direction from a number of possible paths. The current state of the art for the growth of a single crystal for metals includes the floating zone process, the Czochralski process, and the Bridgman method. These methods require a seed or template crystal with the same composition as the desired sample or the use of a crucible to contain the melted sample, which may introduce contamination or reaction with the melt.

Other methods disclose producing a single crystal without the use of a seed crystal. For example, U.S. Pat. No. 7,175,705 to Fujimura et al. discloses a process to produce a semiconductor single crystal without the use of a seed crystal. Fujimura, however, requires that solid raw material be left in the raw material disposed in the crucible to promote nucleation and therefore, prevent the raw material melt from being supercooled in order to produce a single crystal. The disadvantage to Fujimura is that the use of a solid material left in the raw material leads to waste and, thus, is more costly.

Another method, such as the one disclosed in U.S. Pat. No. 6,153,007 to Nakata discloses a method of producing a single crystal without the use of a seed crystal. Nakata, however, requires that the method be performed under micro-gravitational conditions, which are achieved in space stations, space shuttles, rockets and aircraft. Thus, Nakata requires simulations of micro-gravitational conditions, which requires additional equipment and, thus, an increase in cost, in order to produce a single crystal without the use of a seed crystal.

SUMMARY

The following presents a simplified summary in order to provide a basic understanding of some aspects of the innovation. This summary is not an extensive overview of the innovation. It is not intended to identify key/critical elements or to delineate the scope of the innovation. Its sole purpose is to present some concepts of the innovation in a simplified form as a prelude to the more detailed description that is presented later.

Thus, what is required is a device, system and method to produce a single crystal without the use of a seed crystal that overcomes the aforementioned disadvantages.

In one aspect of the innovation, the innovation overcomes the above mentioned disadvantages by providing an innovative cavity pull rod that produces a single to a small number of directionally grown polycrystalline metal alloys without the use of a seed or template crystal. More specifically, the innovation allows for the extraction of a single crystal from a melted alloy.

In another aspect of the innovation, the innovation overcomes the above mentioned disadvantages by providing an innovative a cavity pull rod having an innovative double cavity is provided that is used with the Czochralski process to produce a single or large poly crystalline metal at high temperatures without the use of a seed crystal.

In yet another aspect of the innovation, a pull rod for use in producing a single crystal from a molten alloy is disclosed that includes an elongated rod having a first end and a second end, a first cavity defined at the first end, a second cavity defined at the first end and in communication with the first cavity, wherein the first cavity is adapted to receive the molten alloy and the second cavity is adapted to vent a gas from the molten alloy to thereby template a single crystal when the pull rod is dipped into and extracted from the molten alloy.

In yet another aspect of the innovation, a system for forming a single crystal from a molten alloy is disclosed and includes a crystal growth apparatus that includes a crucible to hold the molten alloy and a heating element that melts the molten alloy. A pull rod is included that has an elongated rod having a first end and a second end, a first cavity defined at the first end, a second cavity defined at the first end and in communication with the first cavity, wherein the first cavity is adapted to receive the molten alloy and the second cavity is adapted to vent a gas from the molten alloy to thereby template a single crystal when the pull rod is dipped into and extracted from the molten alloy.

In still yet another aspect of the innovation, a method of forming a single crystal from a molten alloy is disclosed that includes melting an alloy in a crystal growth apparatus thereby creating a melt, introducing a dopant into the melt, dipping a cavity pull rod into the melt such that the melt enters a first part of a first cavity defined in a first end of the cavity pull rod, venting a gas from the melt through a second cavity defined in the first end of the cavity pull rod that is in communication with the first cavity, forming a single crystal in situ in the first part of the first cavity, extracting the cavity pull rod from the melt, controlling a thermal gradient of the crystal growth apparatus, a rate of extraction, and a rate of rotation of the cavity pull rod, and growing a single crystal ingot.

To accomplish the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

DETAILED DESCRIPTION

Figure 1:
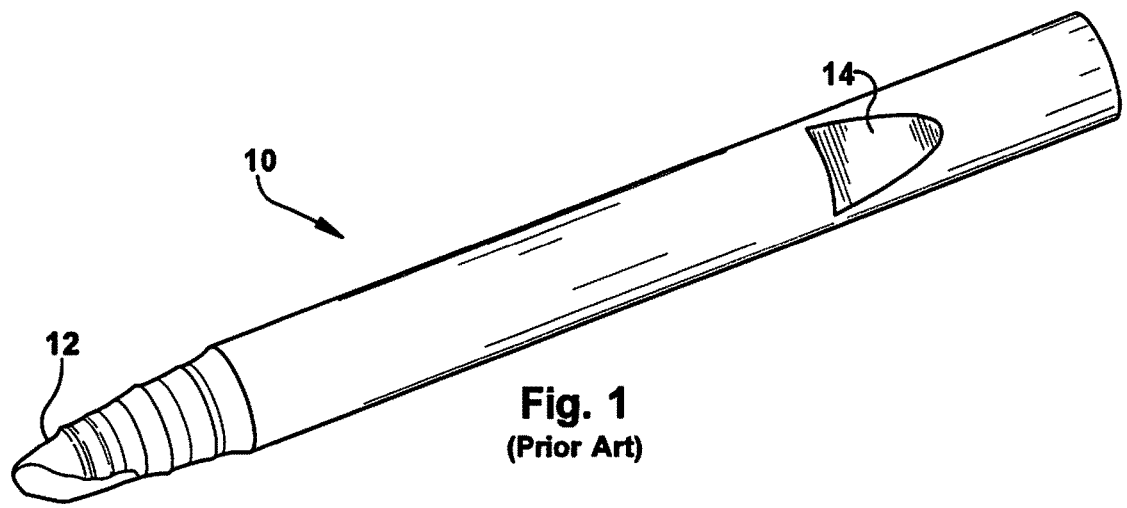
FIG. 1 is a conventional seed crystal puller rod.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

While specific characteristics are described herein (e.g., thickness), it is to be understood that the features, functions and benefits of the innovation can employ characteristics that vary from those described herein. These alternatives are to be included within the scope of the innovation and claims appended hereto.

While, for purposes of simplicity of explanation, the one or more methodologies shown herein, e.g., in the form of a flow chart, are shown and described as a series of acts, it is to be understood and appreciated that the subject innovation is not limited by the order of acts, as some acts may, in accordance with the innovation, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation.

Referring to FIG. 1, FIG. 1 illustrates a conventional puller rod 10 used in conjunction with methods, such as but not limited to the Czochralski process to produce a single crystal that acts a seed crystal to extract a single crystal from a molten alloy, such as silicon. The puller rod 10 is made from the same material (e.g., silicon) as the molten alloy. The puller rod 10 includes a shiny tip 12 that, as mentioned above, acts as a seed crystal when extracting the single crystal from the molten alloy. The puller rod 10 further includes a notch 14 for engagement with a chuck to hold the puller rod 10 in place during the process. The disadvantage to the puller rod 10 is that this puller rod 10 must be made from the same material as the molten alloy ion order to act as a seed crystal. Whereas, as will be seen below, the innovative cavity pull rod disclosed herein can be made from any material since the cavity pull rod is constructed such that a seed crystal is not required.

Figure 2:
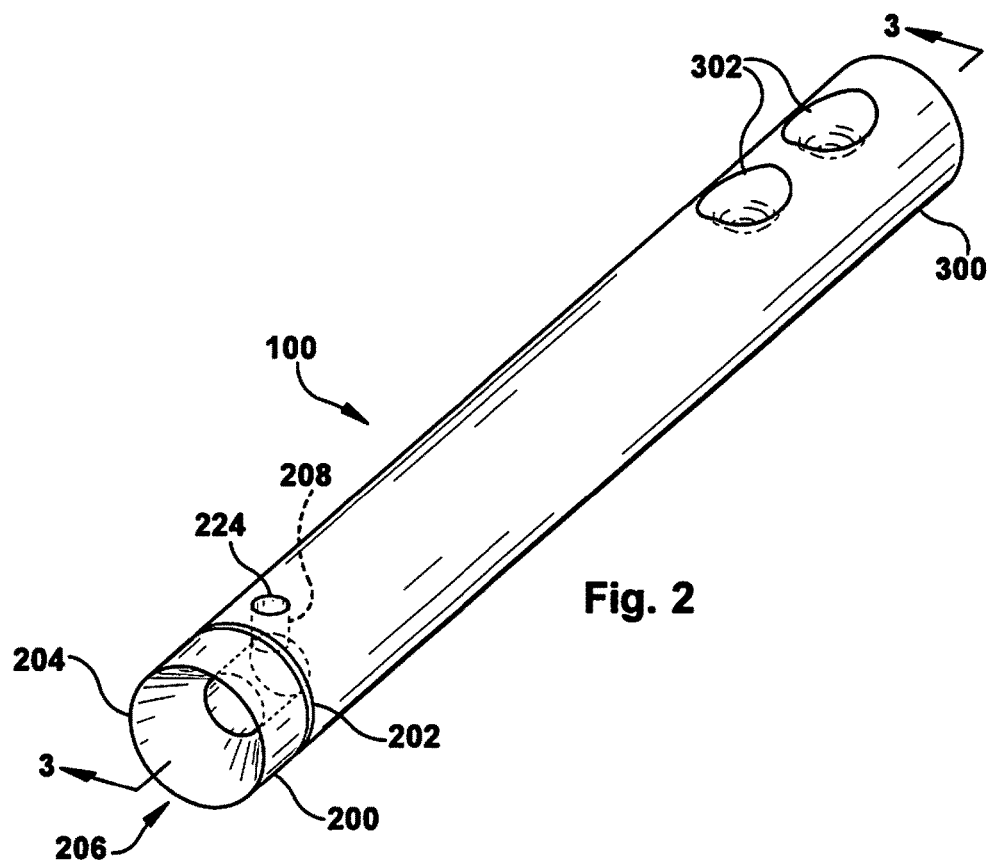
FIG. 2 is a perspective view of an innovative cavity pull rod in accordance with an aspect of the innovation.
Figure 3:
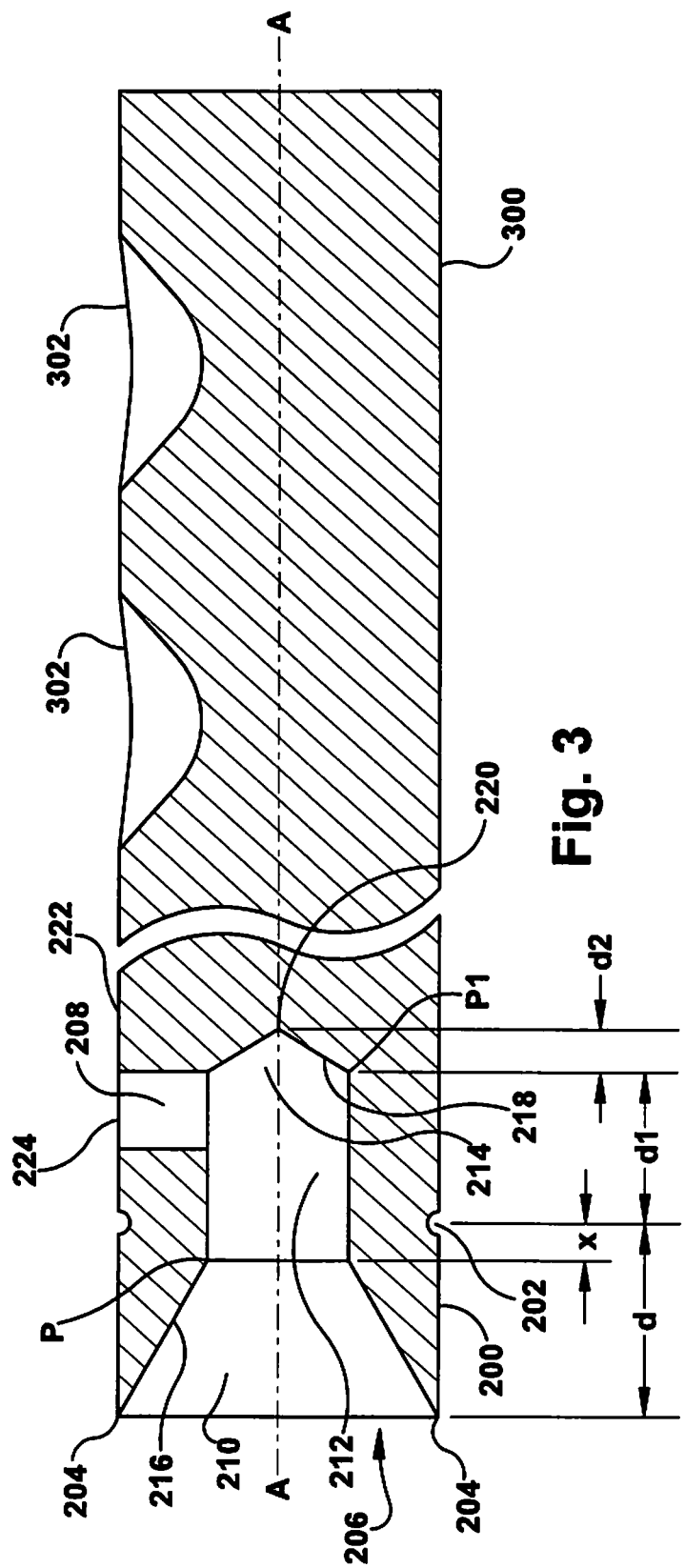
FIG. 3 is a cross section view of the cavity pull rod of FIG. 2 taken along lines 3-3 in accordance with an aspect of the innovation.

Referring now to FIGS. 2 and 3, disclosed herein is an innovative device, system and method to produce a single crystal without the use of a seed crystal in accordance with one aspect of the innovation. The device includes a cavity pull rod 100 that is an elongated, cylindrical, solid rod and includes an innovative double cavity configured to extract a single crystal from a melted alloy (hereinafter "melt") without the use of a seed crystal. The double cavity configuration allows the melt to enter the one cavity of the cavity pull rod while allowing the inert gas to vent from the another cavity (exit port) of the cavity pull rod. This in turn reduces the amount of possible nucleation sites, which, reduces polycrystalline development throughout the crystal.

The cavity pull rod 100 may be used with conventional methods, such as but not limited to the Czochralski process, the Bridgman method, the floating zone process, etc. to produce a single or large poly crystalline metal at high temperatures without the use of a seed crystal. The cavity pull rod 100 may be used to extract a single crystals of semiconductors from a melt, such as but not limited to silicon, germanium, gallium arsenide, etc.). For simplicity, the disclosed innovation will be described using the Czochralski process using silicon as the melt. Thus, the example embodiment disclosed herein is for illustrative purposes only and is not intended to limit the scope of the innovation.

The cavity pull rod 100 has a first end 200 and a second end 300. The first end 200 includes a radial channel (groove) 202 that circumferences the first end 200, whereby the radial channel 202 is longitudinally spaced a distance d from an edge 204 of the first end 200. The first end 200 further includes a double cavity configuration defined therein comprised of a first cavity 206 and a second cavity 208. The first cavity 206 follows the cylindrical shape of the cavity pull rod 100 and is, thus, circular in shape. The first cavity 200 includes a first part 210, a second part 212, and a third part 214.

The first part 210 is a tapered cavity that includes a tapered wall 216 that extends from the edge 204 of the first end 200 inward toward a radial center of the cavity pull rod 100 and, hence toward the second part 212 at an angle of approximately 20-50 degrees with respect to a longitudinal axis A. The first part 210 has an isosceles trapezoidal cross-section, as illustrated in FIG. 3. The first part 210 has a depth of d−x and as a result, a depth of the first part 210 is less than the distance d that the radial channel 202 is from the edge 204 of the first part 210. The significance of this will be explained further below.

The second part 212 intersects the first part 210 at a first intersection defined by points P that define a circle and extends cylindrically from the first intersection toward the second end 300 a distance d1. Thus, the second part 212 has a cylindrical cross section and is substantially parallel with the longitudinal axis A, as illustrated in FIG. 3.

The third part 214 intersects the second part 212 at a second intersection defined by points P1 that define a circle and extends from the second intersection toward the second 300 a distance d2. The third part 214 is a tapered cavity that includes a tapered wall 218 that extends from the second intersection toward the center of the cavity pull rod 100 and, thus, forms a point 220 thereby closing the first cavity 206. Thus, the third part 214 has a triangular cross-section.

Still referring to FIG. 3, the second cavity 208 intersects the second part 212 of the first cavity 206 and extends essentially in a perpendicular manner from the second part 212 toward an outer surface 222 of the cavity pull rod 100 thereby forming an opening 224 defined in the outer surface 222. Thus, the second cavity 208 forms a port from the second part 212 of the first cavity 206 to the outer surface 222 of the cavity pull rod 100. The second cavity 208 has a cylindrical cross section and allows gas to vent from the first cavity 206 during extraction of the single crystal from the melt, which will be explained further below.

Still referring to FIGS. 2 and 3, the second end 300 has at least one recess (or indentation, notch, etc.) 302 that is configured to receive a fastening device, such as but not limited to a set screw to hold the cavity pull rod in place during extraction of the single crystal form the melt. The recess(es) 302 may have any shape, such as but not limited to circular, oval, square, etc. In the example embodiment illustrated in the figures, the recess(es) 302 are on the same longitudinal axis as the opening 224 formed in the outer surface 222 of the cavity pull rod 100. It is to be understood, however, that the recess(es) may be located at any location around the cavity pull rod 100 and are not required to be on the same longitudinal axis as the opening 224.

The cavity pull rod 100 is made from a material, such as but not limited to tungsten, that can withstand high temperatures and that can transfer heat from the melt to the cavity pull rod 100 to facilitate solidification of the pulled crystal as the cavity pull rod 100 is extracted from the melt. More specifically, the configuration of the cavity pull rod 100 allows heat to transfer along a solid longitudinal axis of the cavity pull rod 100, while the tapered configuration of the first cavity 206 allow the melt to remain liquid and in thermal equilibrium with the surrounding melt.

Figure 4:
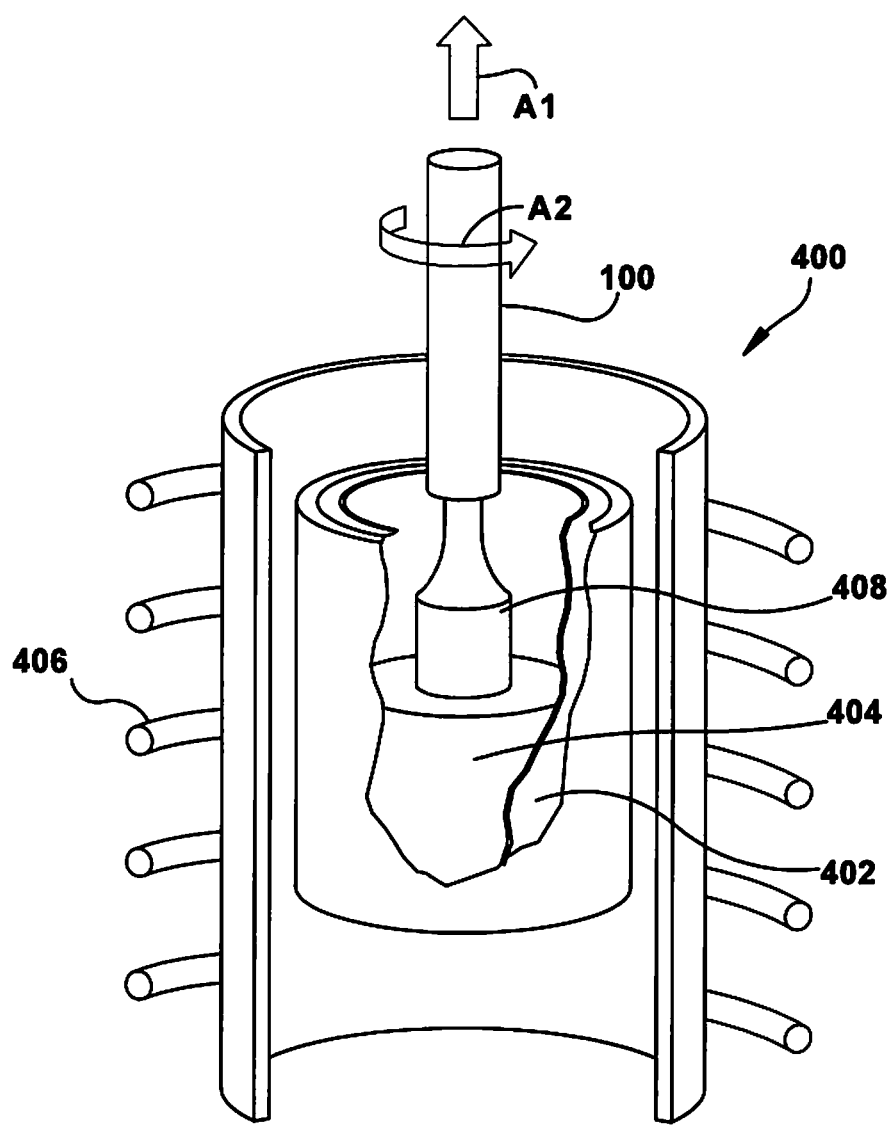
FIG. 4 is an example crystal growth apparatus used to heat a molten alloy for the formation of a single crystal in accordance with an aspect of the innovation.

As mentioned above, the double cavity configuration of the innovative cavity pull rod 100 facilitates the formation of a single crystal from the melt without the need of a seed crystal. The cavity pull rod 100, however, can be used with conventional methods, such as the Czochralski process. Thus, referring to FIGS. 4 and 5, a method of forming a single crystal from the melt will now be described. FIG. 4 shows one example embodiment of a crystal growth apparatus 400 used to form the single crystal. The growth apparatus 400 includes a crucible 402, usually made of quartz, that hold the melt (e.g., silicon) 404 and a heating element 406 to heat the melt 404. The heating element 406 creates a thermal gradient from a bottom to a top of the crystal growth apparatus 400. As will be described below, a single crystal ingot 408 is formed without the use of a seed crystal using the cavity pull rod 100.

Figure 5:
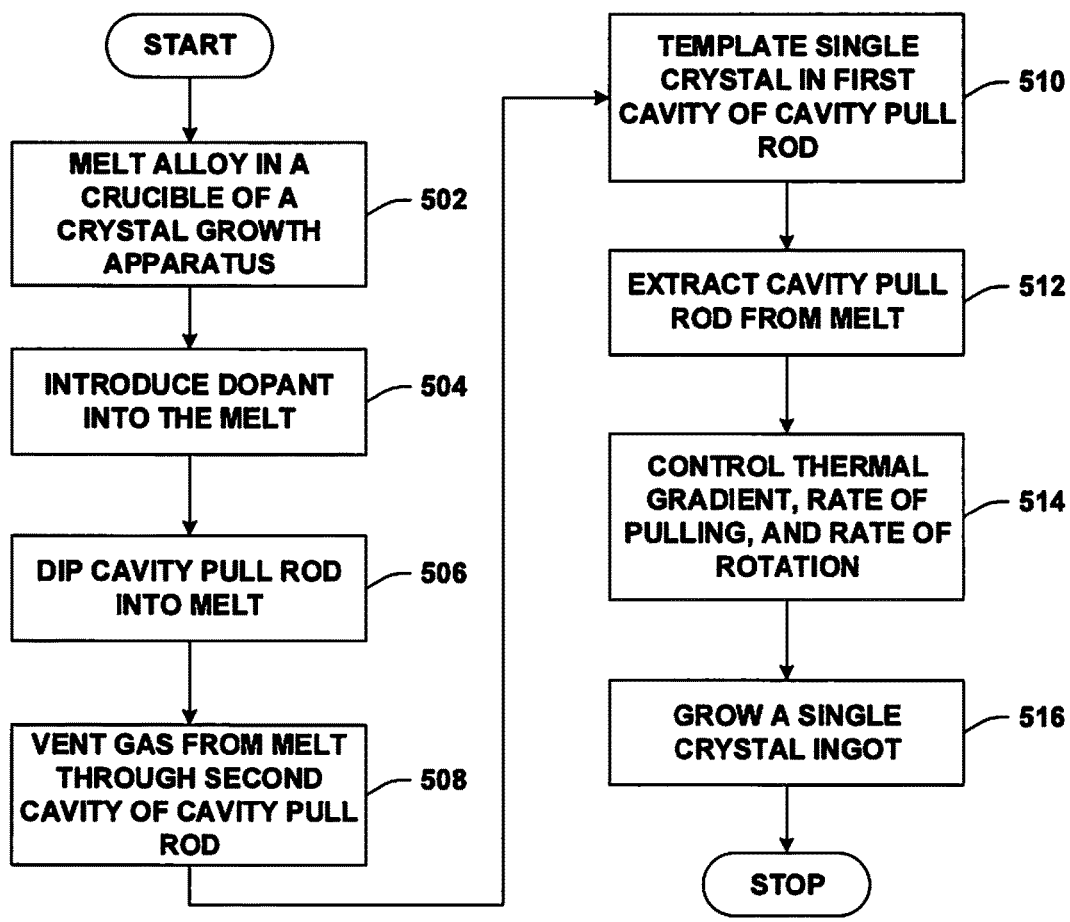
FIG. 5 is a flow chart illustrating the extraction of a single crystal from a melted alloy using the innovative cavity pull rod in accordance with an aspect of the innovation.

Still referring to FIGS. 4 and 5, at 502, an alloy is heated by the heating element, thus, forming a melt 404 in the crucible 402. At 504, an impurity (dopant), usually boron or phosphorous, can be introduced in the melt to thereby dope the melt 404. In the example of silicon, the dopant will change the silicon into an n-type or p-type silicon. At 506, the cavity pull rod 100 is dipped into the melt 404 via a controlled mechanism. The cavity pull rod 100 is secured to the controlled mechanism via a fastening device, such as but not limited to set screws that engage the recess(es) 302 on the second end 300 of the cavity pull rod 100. The cavity pull rod 100 is dipped into the melt 404 such that the melt 404 does not go past the radial channel 202 on the cavity pull rod 100. In other words, the cavity pull rod 100 is dipped into the melt 404 a distance that is less than or equal to the distance d1 that the radial channel is from the edge 204 of the first end 200 of the cavity pull rod 100. At 508, gas from the melt 404 is vented through the second cavity 208, which as mentioned above, reduces the amount of nucleation sites thereby reducing polycrystalline development through the crystal. Thus, at 510, the double cavity configuration of the cavity pull rod 100 results in the formation of a single crystal in situ, in part due to the solidified material of the cavity. At 512, the cavity pull rod 100 is extracted from the melt 404 in a direction indicated by the arrow A1 and is simultaneously rotated in a counter-clockwise direction indicated by the arrow A2. At 514, as the cavity pull rod 100 is being extracted the thermal gradient, rate of extraction, and rate of rotation are precisely controlled, thus, at 516, resulting in the growth of a single crystal ingot 408 in situ until the melt 404 is exhausted.

As described above, a single crystal is formed without the use of a seed crystal due to the double cavity configuration of the cavity pull rod 100. Thus, the single crystal is formed in situ.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A pull rod for use in producing a single crystal from a molten alloy comprising:
    an elongated rod having a first end and a second end;
    a first cavity defined at the first end;
    a second cavity defined at the first end and in communication with the first cavity,
    wherein the first cavity is adapted to receive the molten alloy and the second cavity is adapted to vent a gas from the molten alloy to thereby template a single crystal when the pull rod is dipped into and extracted from the molten alloy.

2. The pull rod of claim 1, wherein the first cavity includes a first part, a second part, and a third part, wherein the second cavity is in communication with the second part.

3. The pull rod of claim 2, wherein the first part of the first cavity has a trapezoidal cross-section, the second part of the first cavity has a cylindrical cross section such that the second part is substantially parallel to a longitudinal axis of the elongated rod, and the third part of the first cavity has a triangular cross section.

4. The pull rod of claim 3, wherein the second cavity extends substantially perpendicular from the second part of the first cavity to an outer surface of the elongated rod thereby defining an opening in the outer surface.

5. The pull rod of claim 4 further comprising a radial channel defined in the first end of the elongated rod, wherein the radial channel is a distance from an edge of the first end that is larger than a depth of the first part of the first cavity.

6. The pull rod of claim 5, wherein the pull rod is dipped into the molten alloy a distance between the distance of the radial channel is from the edge of the first end and the depth of the first part of the first cavity.

7. The pull rod of claim 6 further comprising at least one recess defined in the second end of the elongated rod for the purpose of securing the elongated rod in a controlled mechanism via a fastening device, wherein the at least one recess is on a same longitudinal axis as the opening defined by the second cavity.

8. The pull rod of claim 7, wherein the molten alloy is a silicon alloy.

9. A system for forming a single crystal from a molten alloy comprising:

a crystal growth apparatus including:
  a crucible to hold the molten alloy; and
  a heating element that melts the molten alloy; and
a pull rod including:
  an elongated rod having a first end and a second end;
  a first cavity defined at the first end;
  a second cavity defined at the first end and in communication with the first cavity,
  wherein the first cavity is adapted to receive the molten alloy and the second cavity is adapted to vent a gas from the molten alloy to thereby template a single crystal when the pull rod is dipped into and extracted from the molten alloy.

10. The system of claim 9, wherein the heating element creates a thermal gradient from a bottom to a top of the crystal growth apparatus.

11. The system of claim 10, wherein a first part of the first cavity has a trapezoidal cross-section, a second part of the first cavity has a cylindrical cross section such that the second part is substantially parallel to a longitudinal axis of the elongated rod, and a third part of the first cavity has a triangular cross section.

12. The system of claim 11, wherein the second cavity extends substantially perpendicular from the second part of the first cavity to an outer surface of the elongated rod thereby defining an opening in the outer surface.

13. The system of claim 12 further comprising a radial channel defined in the first end of the elongated rod, wherein the radial channel is a distance from an edge of the first end that is larger than a depth of the first part of the first cavity.

14. The system of claim 13, wherein the pull rod is dipped into the molten alloy a distance between the distance of the radial channel is from the edge of the first end and the depth of the first part of the first cavity.

15. The system of claim 14 further comprising at least one recess defined in the second end of the elongated rod for the purpose of securing the elongated rod in a controlled mechanism via a fastening device, wherein the at least one recess is on a same longitudinal axis as the opening defined by the second cavity.

16. The system of claim 15, wherein the molten alloy is a silicon alloy.

17. A method of forming a single crystal from a molten alloy comprising:
  melting an alloy in a crystal growth apparatus thereby creating a melt;
  introducing a dopant into the melt;
  dipping a cavity pull rod into the melt such that the melt enters a first part of a first cavity defined in a first end of the cavity pull rod;
  venting a gas from the melt through a second cavity defined in the first end of the cavity pull rod that is in communication with the first cavity;
  forming a single crystal in situ in the first part of the first cavity;
  extracting the cavity pull rod from the melt;
  controlling a thermal gradient of the crystal growth apparatus, a rate of extraction, and a rate of rotation of the cavity pull rod; and
  growing a single crystal ingot.

18. The method of claim 17, wherein dipping a cavity pull rod into the melt such that the melt enters a first part of a first cavity defined in a first end of the cavity pull rod includes dipping the cavity pull rod into the melt such that the cavity pull rod is dipped into the melt a distance between a depth of the first part of the first cavity of the cavity pull rod and a distance that a radial channel defined in the first end of the cavity pull rod is from an edge of the first end.

19. The method of claim 18, wherein extracting the cavity pull rod from the melt includes simultaneously rotating the cavity pull rod in a counterclockwise direction.

20. The method of claim 19, wherein the alloy is a silicon alloy.

* * * * *